United States Patent [19]

Kuttner

[11] Patent Number: 5,646,622

[45] Date of Patent: Jul. 8, 1997

[54] ANALOG/DIGITAL CONVERTER

[75] Inventor: Franz Kuttner, Ulrich, Austria

[73] Assignee: Siemens Aktiengesellschaft, Munich, Germany

[21] Appl. No.: 631,804

[22] Filed: Apr. 11, 1996

[30] Foreign Application Priority Data

Apr. 11, 1995 [DE] Germany .................. 195 13 796.5

[51] Int. Cl.⁶ .................................................. H03M 1/12
[52] U.S. Cl. ............................................ 341/172; 341/150
[58] Field of Search ................................. 341/150, 172, 341/138

[56] References Cited

U.S. PATENT DOCUMENTS 4,404,544  9/1983  Dwarakanath .................. 341/172
4,742,330  5/1988  Doernberg et al. ............. 341/159

*Primary Examiner*—Todd DeBoer
*Attorney, Agent, or Firm*—Herbert L. Lerner; Laurence A. Greenberg

[57] ABSTRACT

An analog/digital converter includes a comparator with two inputs and one output. One capacitor is connected between a reference potential and one of the inputs of the comparator. A coupling element is connected between a node point and the other of the inputs of the comparator. N further capacitors each have two terminals. One terminal of each of the further capacitors is connected to the node point. N individually controllable reversing switches each connect the other terminal of a respective one of the further capacitors to an input potential, a first reference potential or a second reference potential. A control device is connected to the output of the comparator and to the reversing switches to control the reversing switches for connecting at least some of the further capacitors to the input potential and for connecting each of the remainder of the further capacitors to one of the two reference potentials, during a transfer phase. The reversing switches include at least some reversing switches having switch positions alternating continuously among one another between the reference potentials until an appearance of a signal change at the output of the comparator, and remaining reversing switches each connecting a respective one of the capacitors to a respective one of the two reference potentials, during a conversion phase.

6 Claims, 4 Drawing Sheets

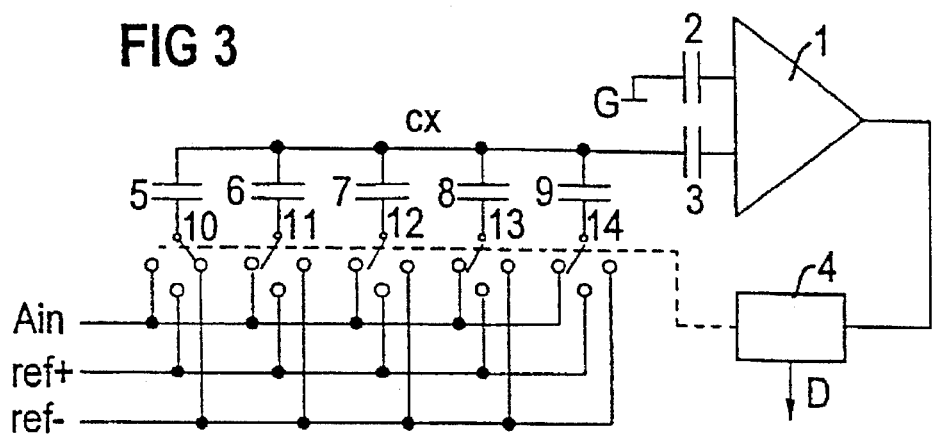
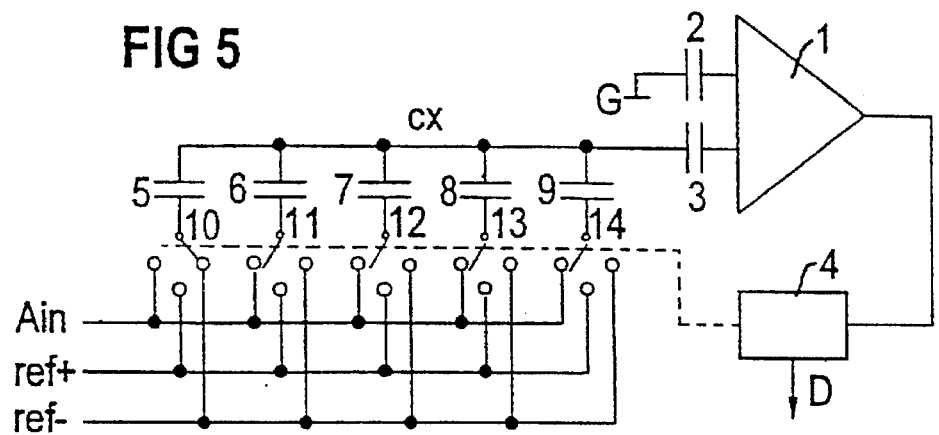
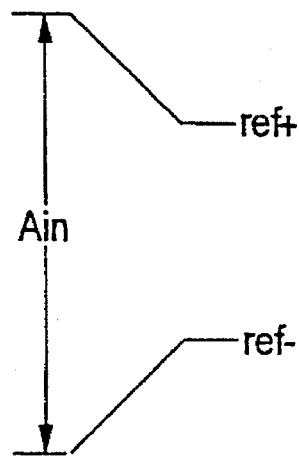

ANALOG/DIGITAL CONVERTER

BACKGROUND OF THE INVENTION

Field of the Invention

The invention relates to an analog/digital converter operating on the principle of successive approximation and having a capacitor network.

Analog/digital converters are known, for instance, from U.S. Pat. No. 4,399,426 and U.S. Pat. No. 4,451,821. Analog/digital converters with a capacitor network are often used whenever neither the analog input nor the reference voltage sources are to be loaded by a static current. Moreover, the capacitor network already furnishes a storage capacity, so that a sample-and-hold circuit preceding the analog/digital converter can be dispensed with.

During a transfer phase, the analog input voltage to be measured is applied to the capacitors. During that time, a voltage at inputs of an offset-compensated comparator is stored in memory. In the conversion phase, a charge at the capacitor network is redistributed, by alternating application of two reference voltages, long enough to ensure that the voltage at the inputs of the comparator is equal, except for a quantization error, to the voltage during the transfer phase.

The position of the reference switch is then equivalent to the digitized value of the analog input voltage.

However, one disadvantage of that converter is that the input voltage region is coupled directly to the reference voltages. At a lower reference voltage of a volts and an upper reference voltage of b volts, an input voltage of a volts, for instance, is converted into a digitally encoded value 0, and the voltage of b volts is converted into a maximum codeable digital value, which is dictated by the number of digits in the digital value.

If, for instance, at the reference voltages of a volts and b volts one wishes to measure a voltage that can be located between a volts and 2×b volts, then the input voltage to be measured must first be put in the appropriate voltage range by a voltage divider. However, with an ohmic voltage divider the converter loses its property of not ohmically burdening the input voltages to be measured.

SUMMARY OF THE INVENTION

It is accordingly an object of the invention to provide an analog/digital converter, which overcomes the hereinaforementioned disadvantages of the heretofore-known devices of this general type and which on one hand has a capacitor input impedance and on the other hand has an input voltage range not defined by reference voltages.

With the foregoing and other objects in view there is provided, in accordance with the invention, an analog/digital converter, comprising a node point; a comparator with two inputs and one output; one capacitor connected between a reference potential and one of the inputs of the comparator; a coupling element connected between the node point and the other of the inputs of the comparator; n further capacitors each having two terminals; one terminal of each of the further capacitors being connected to the node point; n individually controllable reversing switches each connecting the other terminal of a respective one of the further capacitors to one of an input potential, a first reference potential and a second reference potential; and a control device connected to the output of the comparator and to the reversing switches to control the reversing switches for connecting at least some of the further capacitors to the input potential and for connecting each of a remainder of the further capacitors to one of the two reference potentials, during a transfer phase; and the reversing switches including at least some reversing switches having switch positions alternating continuously among one another between the reference potentials until an appearance of a signal change at the output of the comparator, and remaining reversing switches each connecting a respective one of the capacitors to a respective one of the two reference potentials, during a conversion phase.

In accordance with another feature of the invention, at least one of the further capacitors is changed by a given one of the reversing switches connected thereto to one of the reference potentials during the transfer phase, and the switch position of the given reversing switch and of the others of the reversing switches changes continuously until an appearance of a signal change at the output of the comparator, during the conversion phase.

In accordance with a further feature of the invention, at least one of the reversing switches permanently connects the further capacitor being connected thereto to the input potential during the transfer phase and to one of the two reference potentials during the conversion phase.

In accordance with an added feature of the invention, at least one of the reversing switches permanently connects the further capacitor being connected thereto to one of the two reference potentials at a time during the transfer phase and to the other reference potential during the conversion phase.

In accordance with an additional feature of the invention, the coupling element is another capacitor.

In accordance with a concomitant feature of the invention, the other capacitor has two terminals, some of the further capacitors are connected to one of the terminals of the other capacitor and a remainder of the further capacitors are connected to the other of the terminals of the other capacitor.

Other features which are considered as characteristic for the invention are set forth in the appended claims.

Although the invention is illustrated and described herein as embodied in an analog/digital converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic and block circuit diagram of a second exemplary embodiment of an analog/digital converter according to the invention;

FIG. 5 is a schematic and block circuit diagram of a third exemplary embodiment of an analog/digital converter according to the invention;

FIG. 6 is a diagram showing a ratio of the input voltage range to the reference voltage range for the analog/digital converter of FIG. 5;

DESCRIPTION OF THE PREFERRED EMBODIMENTS

Referring now to the figures of the drawings in detail and first, particularly, to FIGS. 1, 3, 5, 7, 13 and 14 thereof, it is seen that a common feature of the analog/digital converters of the invention is that one input, for instance a noninverting input, of a comparator 1 is connected through a capacitor 2 to a reference potential G. Another input, for instance an inverting input, is coupled through a coupling element, such as a wire connection or a capacitor, to a node point cx. A capacitor 3 is preferably provided as the coupling element. The node point cx is also connected to one terminal of each of at least n=5 further capacitors 5–9, each having another terminal which can be connected, through the use of a respective reversing switch 10–14, either to an input potential Ain or a reference potential ref+ or a reference potential ref−, where n−1 is the word width of the converter. The reversing switches 10–14 are controlled by a control device 4 that is connected to an output of the comparator 1 and outputs a digital output signal D.

During a transfer phase, according to the invention, at least some of the capacitors 5–9 are connected to the input potential Ain, and the remaining capacitors are connected either to the reference potential ref+ or the reference potential ref−, through the use of the control device 4. During a conversion phase following the transfer phase, at least some of the capacitors 5–9 have their charge redistributed, by alternating application of the reference voltages ref+ and ref−, until such time as the potential of the node cx again corresponds, except for the quantization error, to the potential during the transfer phase. If that is the case, then the comparator 1 changes its output signal, thus signaling the control device 4 that this stage has been reached. The control device 4 thereupon terminates the variation of the switch positions of the switches 10–14 and outputs a digital signal D corresponding to the last switch position. The variation in switch positions during the conversion phase can be accomplished, for instance, through the use of a counter, which is incremented or decremented from a starting value, with a particular switch position being associated with a particular counter value. Once the appropriate digital signal D has been output, the control device 4 initiates a new transfer phase. The digital signal D can retain its former value until a new value has been ascertained as a result of the next conversion phase.

Figure 1:
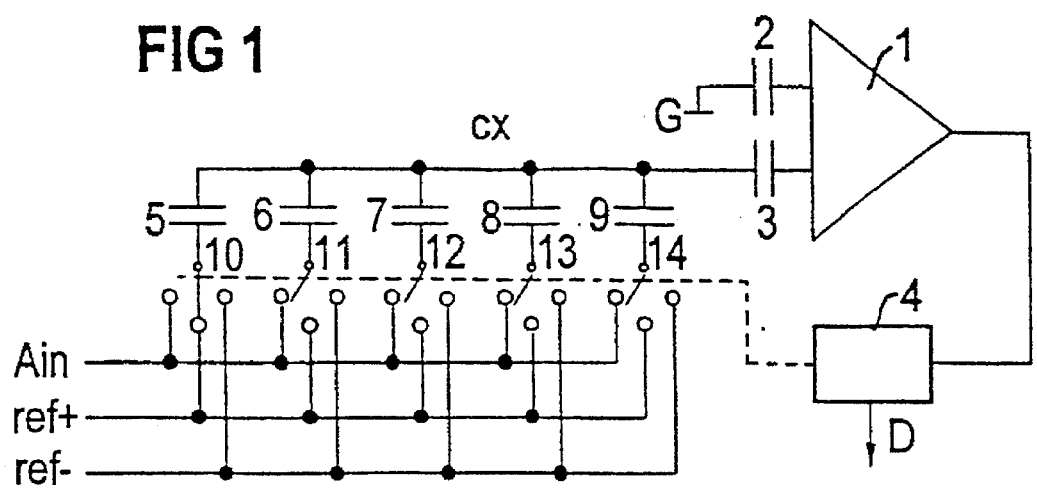
FIG. 1 is a schematic and block circuit diagram of a first exemplary embodiment of an analog/digital converter according to the invention.
Figure 2:
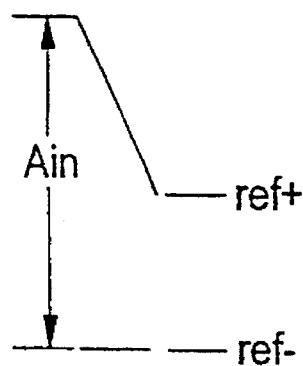
FIG. 2 is a diagram showing a ratio of an input voltage range to a reference voltage range for the analog/digital converter of FIG. 1.

In the exemplary embodiment of FIG. 1, control of the reversing switches 10–14 is effected by the control device 4 in such a manner that during the transfer phase, the capacitor 5 is connected to the reference potential ref−, and the capacitors 6–9 are connected to the input potential Ain. In that case, as is shown in FIG. 2, the allowable range of the input potential Ain on one hand is expanded past the reference potential ref+. On the other hand, the range remains bounded by the reference potential ref−.

Figure 4:
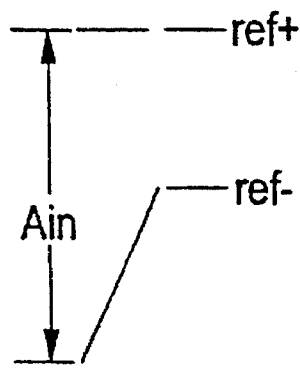
FIG. 4 is a diagram showing a ratio of the input voltage range to the reference voltage range for the analog/digital converter of FIG. 3.
Figure 7:
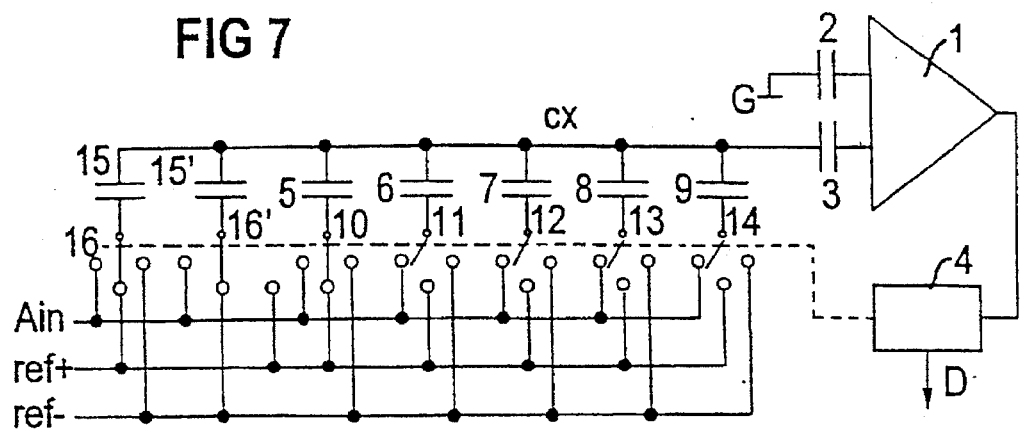
FIG. 7 is a schematic and block circuit diagram of a fourth exemplary embodiment of an analog/digital converter according to the invention.

In the same way, as is shown in FIG. 4, the allowable range of the input potential Ain can be expanded past the reference potential ref−. As is shown in FIG. 3, during the transfer phase the capacitor 5 is applied to the reference potential ref+, while the capacitors 6–9 are connected to the input potential Ain. In that case, however, once again all that happens on one hand is an expansion of the allowable range of the input potential Ain, while on the other hand the range continues to be bounded by the respectively other reference potential, in this case the reference potential ref+.

In order to then expand the range beyond both reference potentials ref+, ref−, the capacitor 5 as shown in FIG. 5 is acted upon by the reference potential ref− and the capacitor 6 by the reference potential ref+ during the transfer phase. Conversely, the capacitors 7–9 are connected to the input potential Ain. The expansion of the range past the respective reference potentials ref+ and ref− is shown in FIG. 6.

The expansion of the range can be expressed in formula form as follows:

$$Ain+ = (ref+) \cdot (Ca/Cr+)$$

and $$Ain- = (ref-) \cdot (Ca/Cr-).$$

In these equations, range boundaries of the input potential Ain are designated by reference symbol Ain+ and Ain−, and the capacitors that can be connected to the input potential Ain are designated by reference symbol Ca, while those that can be connected to the respective reference potential ref−, ref+ are designated by reference symbol Cr−, Cr+. If at a reference voltage ref+=2.5 volts and ref−=0 volts, for instance, the total capacitance of the capacitors applied to the input potential Ain is chosen to be equal to the total capacitance of the capacitors connected to the reference potential ref+, the result is an input range of 0 volts to 5 volts.

In the three cases considered thus far, during the conversion phase all of the capacitors 5–9 are involved in the charge redistribution as a result of the alternating application of the reference potentials ref+, ref−.

Figure 8:
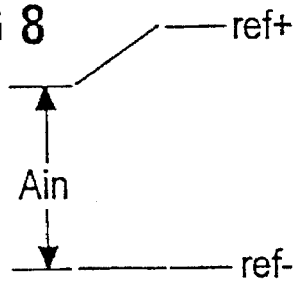
FIGS. 8–12 are diagrams showing ratios of the input voltage range to the reference voltage range for the analog/digital converter of FIG. 7, for different variant circuits.
Figure 9:
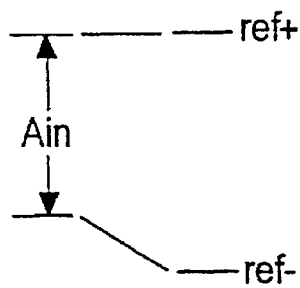

In these cases, however, the assumption is that the allowable range of the input potential is greater than the range bounded by the reference potentials. If a smaller input range is to be adapted to a larger reference range, then according to the invention one additional capacitor is provided. To that end, in the exemplary embodiment of FIG. 7, a capacitor 15 is connected on one hand to the node point cx and on the other hand can be connected through a reversing switch 16 to either the reference potential ref+ or the reference potential ref−. During the transfer phase, the capacitor 15 is connected constantly to the input potential Ain, and during the conversion phase it is connected constantly to one of the two reference potentials ref+ or ref−. If during the conversion phase the capacitor 15 is acted upon by the reference potential ref−, then the allowable input range is restricted with respect to the reference potential ref+, while in the reverse case, that is with constant imposition of the reference potential ref+ on the capacitor 15 during the conversation phase, the allowable input range is restricted relative to the reference potential ref−. The ratio of the allowable range of the input potential Ain to the two reference potentials ref+ and ref− is shown for the first case in FIG. 8, and for the second case in FIG. 9 of the drawing.

Figure 10:
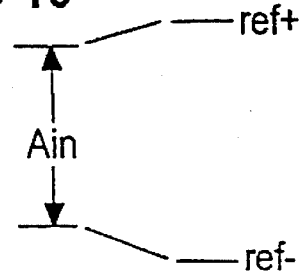
Figure 13:
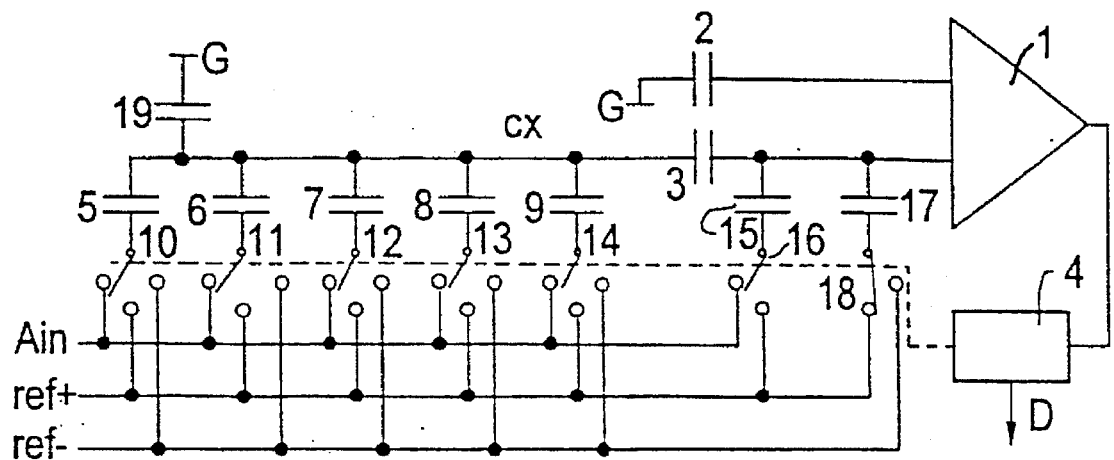
FIG. 13 is a schematic and block circuit diagram of a fifth exemplary embodiment of an analog/digital converter according to the invention.

A restriction toward both reference potentials ref+ and ref− can be attained only by splitting the capacitor 15 into two partial capacitors 15 and 15' during the conversion phase. One partial capacitor 15 is then applied to the reference potential ref− and the other partial capacitor 15' is applied to the reference potential ref+. The restriction of the allowable range of the input potential Ain with respect to the two reference potentials ref+ and ref− is shown in FIG. 10.

Figure 11:
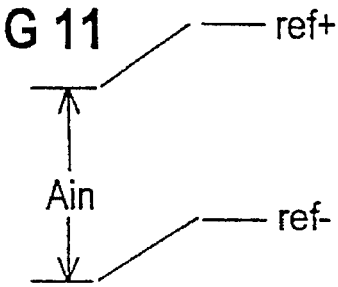
Figure 12:
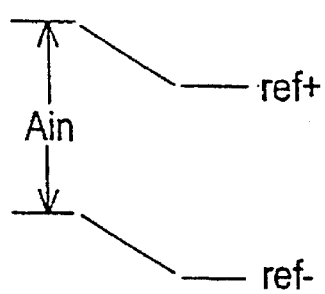

The allowable range of the input potential Ain can be shifted with respect to the reference range if, in accordance with the invention, the additional capacitor is connected to the reference potential ref+ or ref− during the transfer phase and to the respectively other reference potential ref− or ref+ in the conversion phase. The ratio of the allowable range of the input potential Ain to the two reference potentials ref+ and ref− is shown in FIGS. 11 and 12.

The additional capacitor 15 or 15' has the disadvantage of reducing the voltage rise at the node cx, like a parasitic capacitor 19 connected between the node cx and the reference potential G. Moreover, the capacitor 15 or 15' assumes high capacitances, if the allowable range of the input potential Ain is to be shifted very far or is to be sharply reduced. In that case, the capacitor 15 (15') can also be connected to the input of the also-compensated comparator 1, instead of to the node cx. In that case, the necessary capacitance of the capacitor 15 decreases by the ratio of the capacitance of the capacitor 3 to the sum of the capacitances of the remaining further capacitors. In the exemplary embodiment of FIG. 13, this is the sum of the capacitances of the capacitors 5–9. The capacitor 15 is then connected to the other input of the comparator 1 on one hand, and can be connected through the switch 16 to either the input potential Ain or the reference potential ref+ on the other hand. Since it is provided in order to reduce the input range, it is controlled by the control device 4 in such a way that in the transfer phase it is connected to the input potential Ain and during the conversation phase it is connected to the reference potential ref+.

Additionally, however, a shift in the input range is to be accomplished as well. This purpose is served by a capacitor 17, which on one hand is also connected to the other input of the comparator 1 and on the other hand is connected through a reversing switch 18 to one of the two reference potentials ref+ or ref− at a time during the transfer phase and to the respectively other reference potential ref− or ref+ during the conversion phase. Since the capacitors 15 and 17 are connected directly to the other input of the comparator 1, the capacitance of the parasitic capacitor 19 at the node cx must be taken into account in the calculation. Conversely, when the additional capacitors 15 and 17 are connected to the node cx as in FIG. 14, the capacitance of the parasitic capacitor 19 drops out of the calculation and therefore does not affect the precision of the range reduction or range shift.

Figure 14:
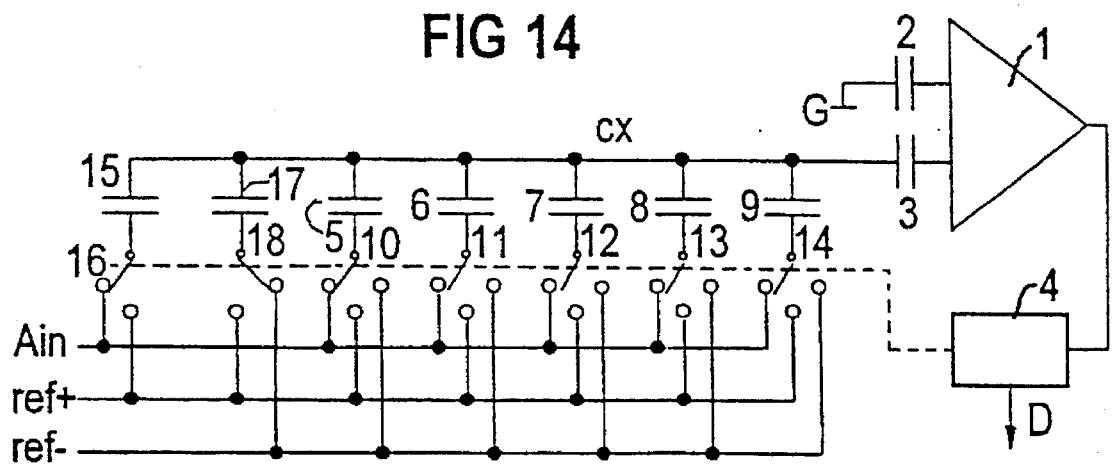
FIG. 14 is a schematic and block circuit diagram of a sixth exemplary embodiment of an analog/digital converter according to the invention.

In order to attain an allowable range of the input potential Ain from 1.6 volts to 3.4 volts in the exemplary embodiment of FIG. 14, the capacitance of the capacitor 15, for a reference voltage ref+ of 2.8 volts and ref− and 0 volts, must be 0.5555 times the total capacity of the network and must be connected to the input potential Ain in the transfer phase. The capacitance of the capacitor 17 must be equal to 0.3333 times the total capacitance of the capacitor network and in the transfer phase must be connected to the reference potential ref−. During the conversion, both capacitors 15 and 17 are acted upon by the reference potential ref+. The total capacitance is equal to the sum of capacitances of the capacitors 5–9. The capacitances of the capacitors 5–9 are preferably binary-weighted among one another.

I claim:

1. An analog/digital converter, comprising:

a node point;

a comparator with two inputs and one output;

one capacitor connected between a reference potential and one of the inputs of said comparator;

a coupling element connected between said node point and the other of the inputs of said comparator;

n further capacitors each having two terminals;

one terminal of each of said further capacitors being connected to said node point;

n individually controllable reversing switches each connecting the other terminal of a respective one of said further capacitors to one of an input potential, a first reference potential and a second reference potential; and a control device connected to the output of said comparator and to said reversing switches to control said reversing switches for connecting at least some of said further capacitors to the input potential and for connecting each of a remainder of said further capacitors to one of the two reference potentials, during a transfer phase; and said reversing switches including at least some reversing switches having switch positions alternating continuously among one another between the reference potentials until an appearance of a signal change at the output of said comparator, and remaining reversing switches each connecting a respective one of said capacitors to a respective one of the two reference potentials, during a conversion phase.

2. The analog/digital converter according to claim 1, wherein at least one of said further capacitors is changed by a given one of said reversing switches connected thereto to one of the reference potentials during the transfer phase, and the switch position of said given reversing switch and of the others of said reversing switches changes continuously until an appearance of a signal change at the output of said comparator, during the conversion phase.

3. The analog/digital converter according to claim 1, wherein at least one of said reversing switches permanently connects said further capacitor being connected thereto to the input potential during the transfer phase and to one of the two reference potentials during the conversion phase.

4. The analog/digital converter according to claim 1, wherein at least one of said reversing switches permanently connects said further capacitor being connected thereto to one of the two reference potentials at a time during the transfer phase and to the other reference potential during the conversion phase.

5. The analog/digital converter according to claim 1, wherein said coupling element is another capacitor.

6. The analog/digital converter according to claim 5, wherein said other capacitor has two terminals, some of said further capacitors are connected to one of the terminals of said other capacitor and a remainder of said further capacitors are connected to the other of the terminals of said other capacitor.

\* \* \* \* \*